United States Patent [19]

Ishigami

[11] Patent Number: 5,665,647

[45] Date of Patent: Sep. 9, 1997

[54] MAKING METAL SILICIDE USING OXIDE FILM

[75] Inventor: Takashi Ishigami, Tokyo, Japan

[73] Assignee: NEC Corporation, Tokyo, Japan

[21] Appl. No.: 611,723

[22] Filed: Mar. 7, 1996

[30] Foreign Application Priority Data

Mar. 8, 1995 [JP] Japan ................... 7-048071

[51] Int. Cl.[6] .................................................. H01L 21/28
[52] U.S. Cl. ......................... 438/664; 438/655; 438/682
[58] Field of Search .............................. 437/200, 193, 437/192, 239

[56] References Cited

U.S. PATENT DOCUMENTS 4,784,973  11/1988  Stevens et al. ........................ 437/200
5,194,405  3/1993  Sumi et al. ............................ 437/200

FOREIGN PATENT DOCUMENTS 2-260630  10/1990  Japan.
4-34926   2/1992   Japan.

Primary Examiner—John Niebling
Assistant Examiner—Thomas G. Bilodeau
Attorney, Agent, or Firm—Foley & Lardner

[57] ABSTRACT

A method of manufacturing a semiconductor device includes the steps of forming a silicon oxide film having a thickness of 5 nm or less on a silicon substrate or polysilicon film with a solution exhibiting an oxidation effect, forming a metal film on the silicon oxide film, and forming a silicide layer on the upper surface of the silicon substrate or polysilicon film by performing predetermined heat treatment.

8 Claims, 4 Drawing Sheets

MAKING METAL SILICIDE USING OXIDE FILM

BACKGROUND OF THE INVENTION

1. FIELD OF THE INVENTION

The present invention relates to a method of manufacturing a semiconductor device and, more particularly, to a method of processing a semiconductor substrate in forming a silicide by growing a thin metal film on the semiconductor substrate.

2. DESCRIPTION OF THE PRIOR ART

With an increase in the integration degree of a semiconductor device, the gate interconnection width and thickness decrease. Decreases in the width and thickness of gate interconnections and diffusion layers inevitably cause an increase in interconnection resistance, greatly influencing a delay in a circuit operation. In a micropatterned semiconductor device, therefore, a technique based on a refractory metal silicide has recently been used as a technique of attaining a decrease in resistance.

As a conventional method of forming a diffusion layer by using a silicide, a manufacturing method disclosed in Japanese Unexamined Patent Publication No. 4-34926 will be described with reference to FIGS. 1A to 1G. In this method, a silicon oxide film is formed on the upper surface of a silicon substrate before deposition of titanium as a refractory metal on the substrate to reduce the rate at which the silicide film consisting of titanium (to be simply referred to as the silicide film hereinafter) is formed, thereby preventing an unnecessary silicide from growing on an element isolation oxide film or an oxide film on a side wall of a gate electrode and causing short circuit in the device.

As shown in FIG. 1A, a field insulating film 42 for element isolation is formed on a p-type silicon substrate 41, and the gate electrode of a MOS transistor and a side wall spacer are formed in a region (not shown). As shown in FIG. 1B, after a spontaneous oxide film on an element region is completely removed by dilute hydrofluoric acid, a polysilicon film 45 is deposited. This polysilicon film is oxidized to form a silicon oxide film 44 having a thickness of about 10 nm on the element region, as shown in FIG. 1C. Thereafter, as shown in FIG. 1D, ion implantation and heat treatment are performed to form a source/drain region 43 of the MOS transistor. Further, as shown in FIG. 1E, the silicon oxide film 44 is etched to a thickness of about 5 nm with a dilute hydrofluoric acid. As shown in FIG. 1F, a titanium film 46 is formed on the entire surface of the resultant structure. Heat treatment based on lamp annealing is then performed for the resultant structure to form a silicide film 47, as shown in FIG. 1G. After this process, the remaining unreacted titanium is removed by an etching process using a solution mixture of ammonia and hydrogen peroxide which is generally used. The formed silicide film 47 undergoes lamp annealing again at a temperature of about 800° C. to 900° C. to cause phase transition to a C54 structure as a low-resistance silicide crystal structure.

Another conventional manufacturing method is disclosed in Japanese Unexamined Patent Publication No. 2-260630. The source/drain region of a MOS transistor is formed on a silicon substrate by a conventional manufacturing method. Thereafter, a spontaneous oxide film on an element region is completely removed with dilute hydrofluoric acid, and an oxide film having a thickness of 5 nm to 30 nm is formed by thermal oxidation. Titanium is deposited on the entire surface of the resultant structure, and heat treatment based on lamp annealing is performed to form a silicide film. After this process, the remaining unreacted titanium is removed by an etching process using a solution mixture of ammonia and hydrogen peroxide which is generally used. The formed silicide film 47 undergoes lamp annealing again at a temperature of about 800° C. to 900° C. to cause phase transition to a low-resistance crystal structure.

With the tendency toward an increase in the integration degree of a MOS transistor, a diffusion layer tends to form a shallower junction. With this tendency, demands have arisen for thinner silicide films. For thinner silicide films, several methods may be considered. Of these methods, a method of decreasing the thickness of a titanium deposition film itself is effective.

Conventionally, a titanium deposition film is thick, and hence a silicide film is also thick. For this reason, no serious problems have been posed regarding the state of the interface between a silicon film and a metal film in the early stage of silicide reaction. In a transistor having a size of half a micron or less, the thickness of a titanium deposition film needs to be 50 nm or less because of the relationship between the junction depth of a diffusion layer and the thickness of a silicide film. Consequently, a formed silicide film becomes thinner, the silicide film has uneven portions in terms of film thickness owing to the influence of a spontaneous oxide film at the interface between the silicon film and the metal film. Especially when the thickness of a titanium deposition film becomes 35 nm or less, the unevenness of the thickness of the silicide film causes agglomeration of the silicide film in heat treatment in the subsequent step. As a result, the diffusion layer resistance increases to cause variations in transistor characteristics.

In the prior art, an oxide film is removed with dilute hydrofluoric acid before deposition of titanium. As shown in FIG. 2, however, when about three hours have elapsed after the dilute hydrofluoric acid treatment, a spontaneous oxide film grows to such an extent that the formation of a silicide film is affected. When the thickness of a titanium deposition film is 35 nm, metal sputtering may be performed immediately after dilute hydrofluoric acid treatment to eliminate the influence of a spontaneous oxide film. On a manufacturing line for mass production, it is difficult to reliably ensure the time for metal sputtering within three hours after dilute hydrofluoric acid treatment.

In the above conventional technique, in forming an oxide film on a diffusion layer, variations in film thickness in forming a polysilicon film, variations in an etching process using dilute hydrofluoric acid, and the like occur. As a result, an oxide film formed on an element region varies in thickness within a silicon wafer plane. The formed silicide film also varies in thickness, resulting in variations in sheet resistance. In addition, when an oxide film is directly formed on a silicon substrate by thermal oxidation, the resultant film is a dense, rigid oxide film. This will interfere with the formation of a silicide film.

SUMMARY OF THE INVENTION

The present invention has been made in consideration of the above situation, and has as its object to provide a semiconductor device manufacturing method of safely forming a low-resistance silicide film for a MOS transistor.

In order to achieve the above object, according to the first aspect of the present invention, there is provided a method of manufacturing a semiconductor device, comprising the steps of forming a silicon oxide film having a thickness of not more than 5 nm on a silicon substrate with a solution exhibiting an oxidation effect, forming a metal film on the silicon oxide film, and forming a silicide layer on an upper surface of the silicon substrate by performing predetermined heat treatment.

According to the second aspect of the present invention, there is provided a method of manufacturing a semiconductor device, comprising the steps of forming an oxide film having a thickness of not more than 5 nm on a polysilicon film with a solution exhibiting an oxidation effect, forming a metal film on the oxide film, and forming a silicide layer on an upper surface of the polysilicon film by performing predetermined heat treatment.

In addition, in the first and second aspects of the present invention, the solution exhibiting the oxidation effect is a hydrogen peroxide solution, and the metal film is a titanium film.

As the heat treatment, lamp annealing is performed in the range of 600° C. to 700° C. or 800° C. to 900° C.

According to the semiconductor device manufacturing method of the present invention, in forming a silicide film, oxidation is performed by using a hydrogen peroxide immediately after a spontaneous oxide film is removed with dilute hydrofluoric acid before deposition of a titanium film. With this process, a uniform silicide film can be formed without being influenced by a spontaneous oxide film.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF PREFERRED EMBODIMENT

Figure 3A:
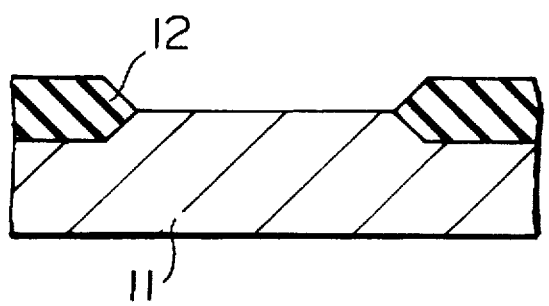
FIGS. 3A to 3F are sectional views showing the respective steps in a manufacturing process to explain a method of manufacturing a semiconductor device according to an embodiment of the present invention.
Figure 3B:
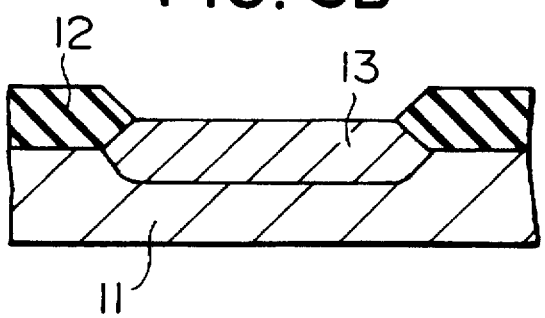
Figure 3C:
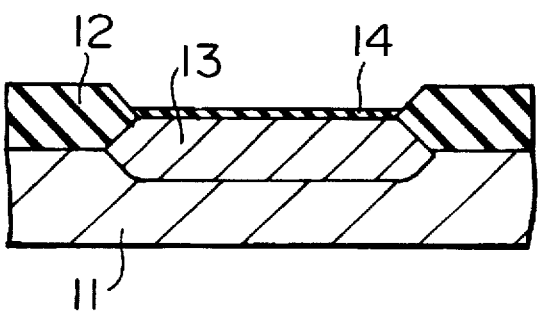
Figure 3D:
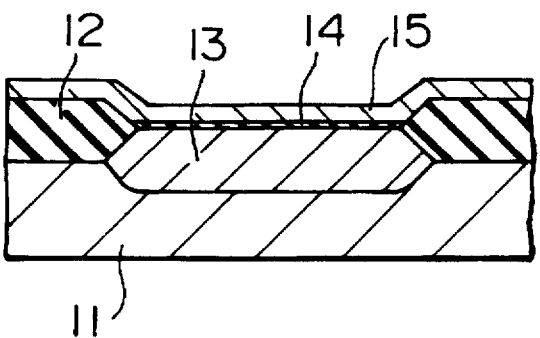

Several preferred embodiments of the present invention will be described below with reference to the accompanying drawings. FIGS. 3A to 3F are sectional views sequentially showing the steps in an embodiment of the present invention. As shown in FIG. 3A, a field insulating film 12 consisting of silicon dioxide for element isolation is formed on a p-type silicon substrate 11. As shown in FIG. 3B, impurity ions such as boron ions are implanted first, and heat treatment is then performed at 800° C. to 1,000° C. to form a diffusion layer 13. After a spontaneous oxide film on the upper surface of the diffusion layer is removed with dilute hydrofluoric acid, the resultant structure is continuously dipped in a solution exhibiting an oxidation effect such as a hydrogen peroxide solution for three minutes to intentionally oxidize the upper surface of the diffusion layer to a thickness of about 3 nm, thereby forming a silicon oxide film 14, as shown in FIG. 3C. In this case, if the thickness of the silicon oxide film 14 is larger than 5 nm, the silicon oxide film 14 becomes a barrier to the formation of a silicide film. As a result, a low-resistance silicide film cannot be formed. As shown in FIG. 3D, a titanium film is deposited on the entire surface of the resultant structure to a thickness of about 50 nm, and lamp annealing is performed in an $N_2$ atmosphere at a temperature of 600° C. to 700° C. The lamp annealing temperature is set such that a silicide film having a sufficient thickness is formed, and over-growth of a silicide outside an element region is suppressed. At this time, the silicon oxide film 14 between the p-type silicon substrate 11 and the titanium film 15 is uniform in thickness unlike a spontaneous oxide film. When silicon is diffused from the p-type silicon substrate 11 into the oxide film to react with titanium, a uniform silicide film can be formed. At the same time, since oxygen in the silicon oxide film 14 reacts with titanium, the silicon oxide film 14 is not left finally.

Figure 3E:
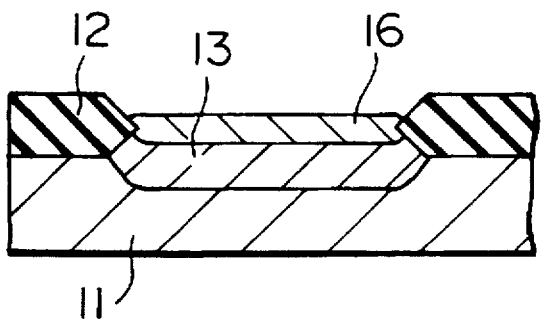
Figure 3F:
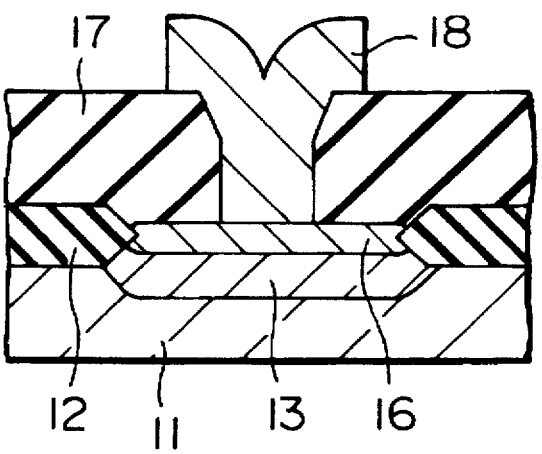

Subsequently, unreacted titanium and titanium nitride are removed by a selective etching process using a solution mixture of ammonia and hydrogen peroxide. A silicide film 16 formed in this manner is subjected to lamp annealing at an annealing temperature of 800° C. to 900° C. to cause phase transition to a C54 structure as a low-resistance silicide crystal structure, as shown in FIG. 3E. This annealing temperature is set such that a failure in phase transition to the C54 structure and agglomeration on the silicide film 16 are prevented. Thereafter, similar to the steps in the conventional technique, an insulated interlayer 17 is formed by using a silicon oxide film containing phosphorus and boron, as shown in FIG. 3F, and a contact hole and an aluminum interconnection 18 are formed by using photolithography and a dry etching technique.

Figure 4A:
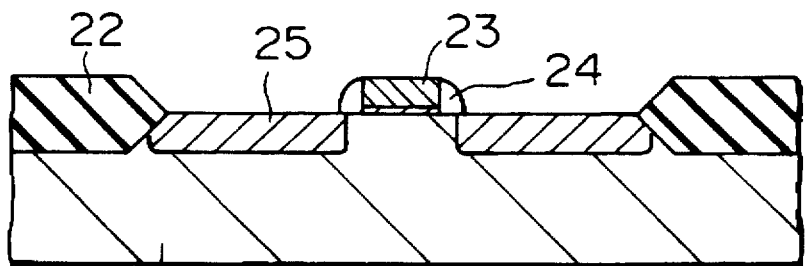
FIGS. 4A to 4E are sectional views showing the respective steps in a manufacturing process to explain a method of manufacturing a semiconductor device according to another embodiment of the present invention.
Figure 4B:
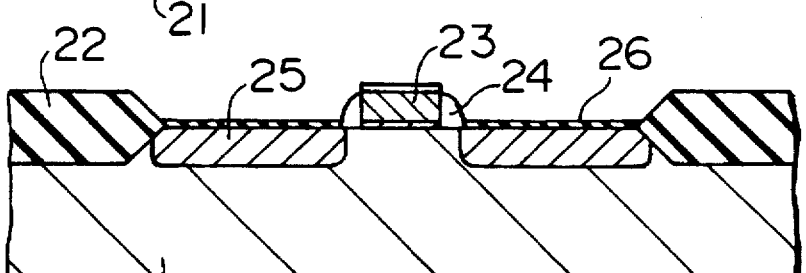
Figure 4C:
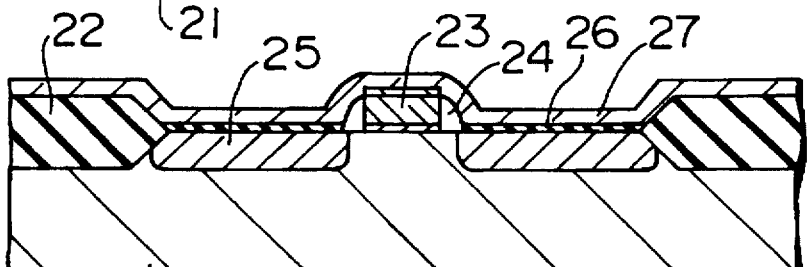
Figure 4D:
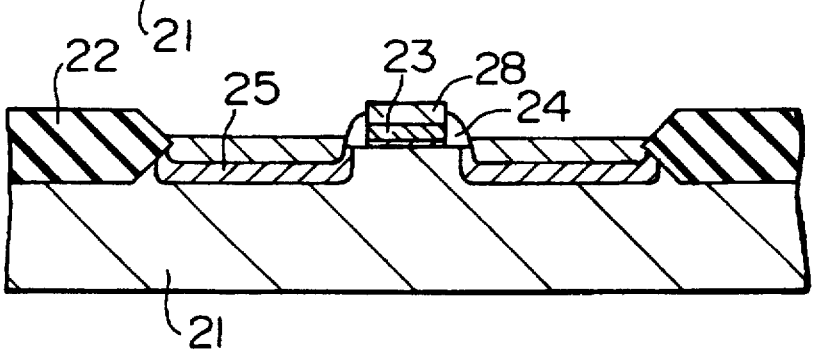
Figure 4E:
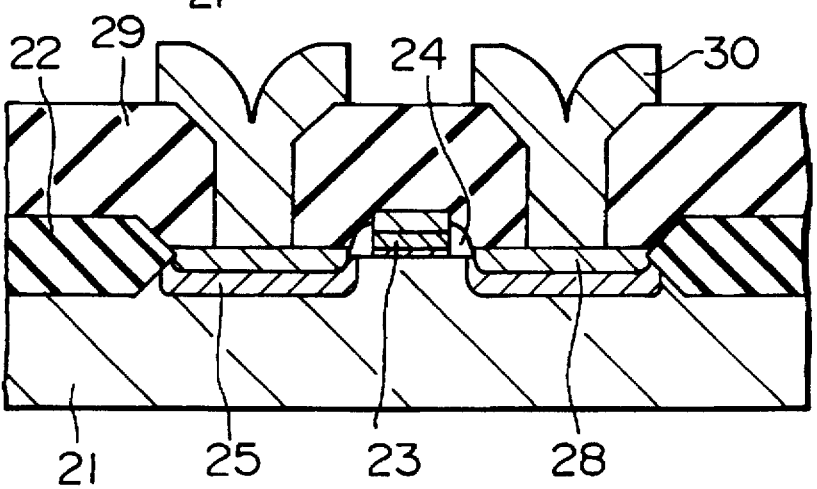

Another embodiment of the present invention will be described next with reference to FIGS. 4A to 4E. As shown in FIG. 4A, a field insulating film 22 for element isolation is formed on a p-type silicon substrate 21, and impurity ions for threshold voltage regulation are implanted into an element region. A silicon oxide film as a gate insulted film is then formed by a thermal oxidation method. A polysilicon film is formed on the entire surface by a CVD method, and the polysilicon film and the gate insulating film are patterned into a desired shape by photolithography and a dry etching technique to form a gate electrode 23. After a silicon oxide film is deposited on the entire surface of the resultant structure by the CVD method, a side wall spacer 24 consisting of a silicon oxide film is formed on each side wall of the gate electrode 23 by anisotropic dry etching. Thereafter, impurity ions such as phosphorous and boron ions are implanted, and heat treatment is performed at 800° C. to 1,000° C. to form diffusion layers 25 serving as the source and drain of a transistor. At the same time, an impurity is diffused into the polysilicon of the gate electrode 23. After this process, the polysilicon of the gate electrode 23 and a spontaneous oxide film on the upper surface of the diffusion layer are removed with dilute hydrofluoric acid, and the resultant structure is continuously dipped in a solution exhibiting an oxidation effect such as a hydrogen peroxide solution for several minutes to intentionally oxidize the polysilicon and the upper surface of the diffusion layer to a thickness of about 3 nm, thereby forming a silicon oxide film 26, as shown in FIG. 4B. As shown in FIG. 4C, a titanium film 27 is deposited on the entire surface of the resultant structure, and lamp annealing is performed in an $N_2$ atmosphere at 600° C. to 700° C. As a result, a uniform silicide film can be formed on the polysilicon as well as on the diffusion layers 25. As shown in FIG. 4D, unreacted titanium is removed by selective etching. Thereafter, lamp annealing is performed again to cause phase transition of a silicide film 28. As shown in FIG. 4E, after an insulating interlayer 29 is formed, a contact hole and an aluminum interconnection 30 are formed.

Figure 1A:
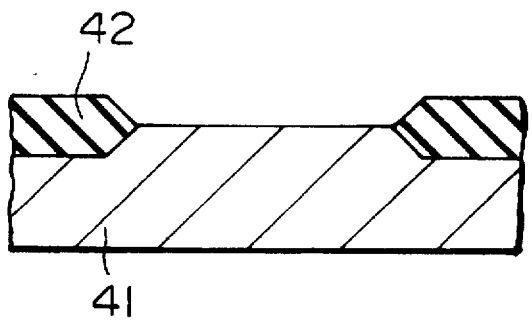
FIGS. 1A to 1G are sectional views showing the respective steps in a manufacturing process to explain a conventional technique.
Figure 1B:
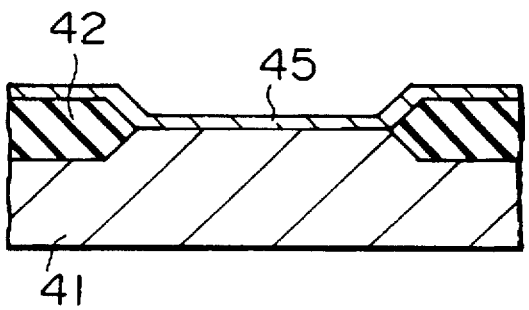
Figure 1C:
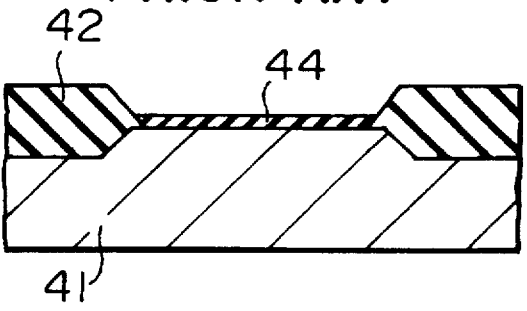
Figure 1D:
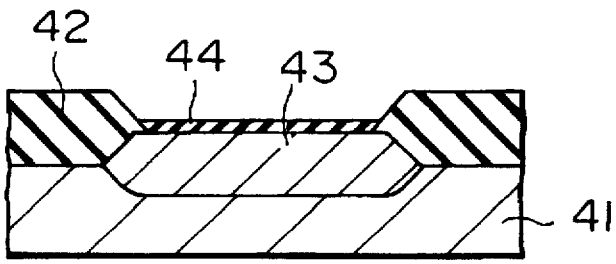
Figure 1E:
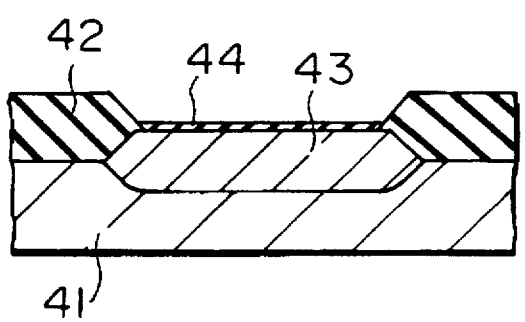
Figure 1F:
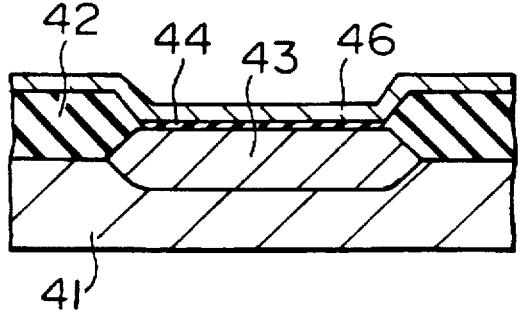
Figure 1G:
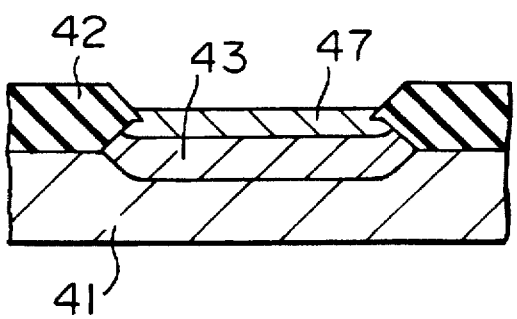
Figure 2:
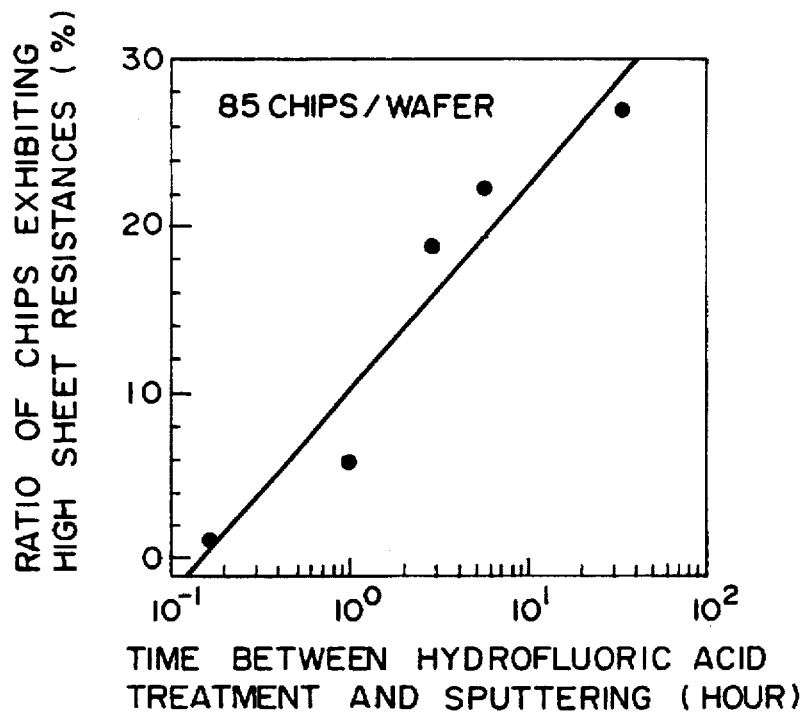
FIG. 2 is a graph showing the relationship between the ratio of chips having high sheet resistances and the pre-process time in the conventional technique.
Figure 5:
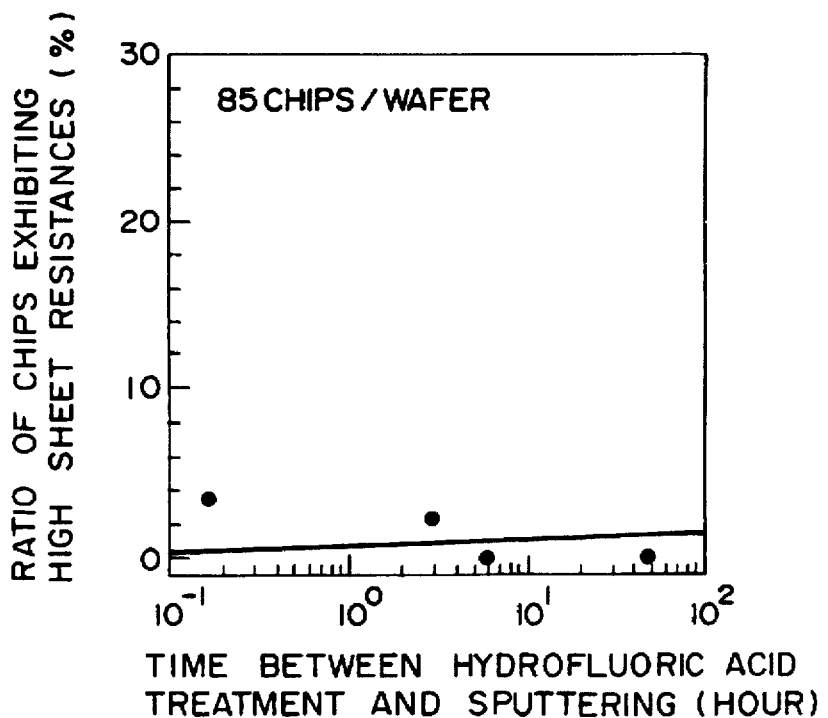
FIG. 5 is a graph showing the relationship between the ratio of chips having high sheet resistances and the pre-process time in the present invention.

As described above, when several hours have elapsed after hydrofluoric acid treatment, the ratio of chips in which the sheet resistances of silicide films are high increases to 20% or more, as shown in FIG. 2. In contrast to this, with regard to chips dipped in a hydrogen peroxide solution for several minutes after hydrofluoric acid treatment, the ratio of chips exhibiting high resistances remains 4% or less even when 48 hours have elapsed until deposition of a metal after treatment, as shown in FIG. 5. As described above, by performing treatment using a hydrogen peroxide solution immediately after hydrofluoric acid treatment, a thin silicide film with little variations in resistance can be formed.

What is claimed is:

1. A method of manufacturing a semiconductor device, comprising the steps of:

forming a silicon oxide film having a thickness of not more than 5 nm on a silicon substrate with a solution exhibiting an oxidation effect;

forming a metal film on the silicon oxide film; and forming a silicide layer on an upper surface of the silicon substrate by performing heat treatment.

2. A method of manufacturing a semiconductor device, comprising the steps of:

forming an oxide film having a thickness of not more than 5 nm on a polysilicon film with a solution exhibiting an oxidation effect;

forming a metal film on the oxide film; and forming a silicide layer on an upper surface of the polysilicon film by performing heat treatment.

3. A method according to claim 1, wherein the solution exhibiting the oxidation effect is a hydrogen peroxide solution.

4. A method according to claim 2, wherein the solution exhibiting the oxidation effect is a hydrogen peroxide solution.

5. A method according to claim 1, wherein the metal film is made of a titanium film.

6. A method according to claim 2, wherein the metal film is made of a titanium film.

7. A method according to claim 1, wherein the heat treatment is lamp annealing performed in one of temperature ranges of 600° C. to 700° C. and 800° C. to 900° C.

8. A method according to claim 2, wherein the heat treatment is lamp annealing performed in one of temperature ranges of 600° C. to 700° C. and 800° C. to 900° C.

* * * * *